Figure 1:
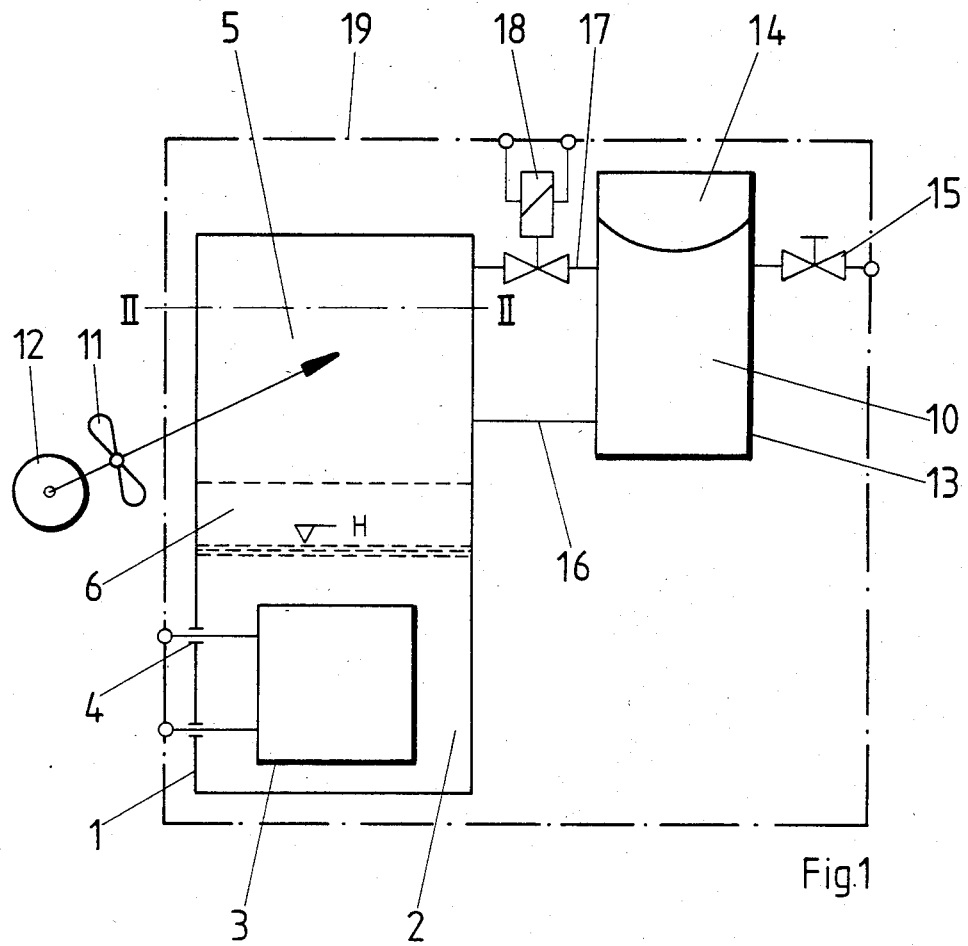

United States Patent [19]

Klein

[11] Patent Number: 4,566,529

[45] Date of Patent: Jan. 28, 1986

[54] COOLING DEVICE, IN WHICH CONVERTERS OR RECTIFIERS OR OTHER SEMICONDUCTOR COMPONENTS ARE IMMERSED IN BOILING LIQUOR

[75] Inventor: Erwin Klein, Heddesheim, Fed. Rep. of Germany

[73] Assignee: Brown, Boveri & Cie AG, Mannheim-Käfertal, Fed. Rep. of Germany

[21] Appl. No.: 537,354

[22] Filed: Sep. 29, 1983

[30] Foreign Application Priority Data

Oct. 2, 1982 [DE] Fed. Rep. of Germany ....... 3236612

[51] Int. Cl.⁴ .............................................. H05K 7/20
[52] U.S. Cl. ...................................... 165/32; 361/384; 361/385; 165/104.14; 165/104.33; 165/141; 174/15 R
[58] Field of Search ........................ 307/117; 363/141; 165/140, 141, 104.33, 18, 32, 39, 104.14, 104.27; 174/15 R; 361/384, 385; 357/82; 336/55, 57, 58

[56] References Cited

U.S. PATENT DOCUMENTS

| | | | |
|---|---|---|---|
| 3,609,991 | 10/1971 | Chu | 361/385 |
| 4,057,104 | 11/1977 | Altoz | 165/32 H |
| 4,260,014 | 4/1981 | Feehan | 165/104.33 |
| 4,306,613 | 12/1981 | Christopher | 165/32 H |
| 4,350,026 | 9/1982 | Klein | 357/82 |

Primary Examiner—G. P. Tolin
Attorney, Agent, or Firm—Hernert L. Lerner; Laurence A. Greenberg

[57] ABSTRACT

Cooling device for semiconductor components, including a chamber for receiving semiconductor components, boiling liquid disposed in the chamber for immersing the semiconductor components, a device connected to the chamber for supplying a cooling air to eliminate a temperature rise of the boiling liquid and to remove a maximum power loss at a normal maximum ambient temperature, a thermal energy accumulator connected to the chamber, and a device for switching off the cooling air supply device and switching on the thermal energy accumulator if the ambient temperature of the cooling air rises.

5 Claims, 2 Drawing Figures

COOLING DEVICE, IN WHICH CONVERTERS OR RECTIFIERS OR OTHER SEMICONDUCTOR COMPONENTS ARE IMMERSED IN BOILING LIQUOR

The invention relates to a cooling device in which rectifiers or other semiconductor components to be cooled are immersed in boiling liquid, the temperature rise of the boiling liquid is removed by means of cooling air, and the cooling device is constructed for removal of the maximum power loss at a normal maximum ambient temperature, such as on a hot summer day.

While the power loss of rectifiers can also be removed by other cooling devices, cooling by boiling is particularly advantageous if a highly electrically insulating medium such as hydro fluorochloric acid is used as the boiling liquid. In this case, the components carrying an electric voltage can be immersed directly in the boiling liquid so that the best possible thermal contact is obtained.

With this so-called "tank cooling", the heat absorbed by the boiling liquid can be removed directly through the wall of the tank. The wall of the tank should have a surface area which is as large as possible. This can be achieved by using cooling fins. However, the vapor produced during the boiling can also be fed to a separate heat exchanger and the tank can be made of plastic, for instance, so that it is non-magnetic but it is also thermally highly insulating. In converters with electromagnetic leakage fields, such a tank may be advantageous. In both types of tank, the heat removal to the air can be accomplished by natural or forced convection, the latter providing better cooling conditions.

In all boiling liquids there is a relationship between the boiling temperature and the prevailing pressure. If a tank is evacuated and the required quantity of boiling liquid is filled in, boiling sets in immediately until a pressure corresponding to the filling temperature is obtained. By utilizing the degree of evacuation, it is possible to choose that boiling temperature which is desired at the most unfavorable, i.e., the highest, ambient temperature. This temperature value can, of course, only be kept if the power loss and the thermal resistances are matched to each other.

With maximum power loss and maximum ambient temperature, a situation can occur in which a state of thermal equilibrium exists and the temperature of the environment, i.e., of the cooling air, is then raised further. If all other conditions are not then changed, less and less power can be removed to the environment with increasing over-temperature. As soon as the temperature of the cooling air corresponds to the temperature of the cooling surface, heat removal is no longer possible and with further increasing cooling temperature, the direction of the energy flow is even reversed. Since a reversal of the energy flow can never be permitted, forced convection must be prevented in such a case.

It is basically possible to obtain further cooling by supplemental devices, for instance, by adding a refrigeration unit. This, however, requires more supply power. Additional cooling can also be made possible by boiling cooling which is the placement of the components in a boiling liquid which acts directly on the air. However, this boiling cooling acting on the air has the disadvantage of permitting a loss of boiling liquid and should therefore not be considered for electric equipment which is not supposed to require servicing. For over temperatures which only prevail for a limited time, the prior art device are too expensive.

It is accordingly an object of the invention to provide a cooling device in which converters or rectifiers or other semiconductor components are immersed in boiling liquid, which overcomes the above-mentioned disadvantages of the heretofore-known devices of this general type, and in which an overtemperature only occurs for a limited time.

With the foregoing and other objects in view there is provided, in accordance with the invention, a cooling device for converters or other semiconductor components, comprising a chamber for receiving semiconductor components, boiling liquid disposed in the chamber for immersing the semiconductor components, means connected to the chamber for supplying a cooling air to eliminate a temperature rise of the boiling liquid and to remove a maximum power loss at a normal maximum ambient temperature such as on a hot summer day, a thermal energy accumulator connected to the chamber, and means for switching off the cooling air supply means and switching on the thermal energy accumulator if the ambient temperature of the cooling air rises.

In accordance with another feature of the invention, the switching means is a thermoelectric switching device.

In accordance with a further feature of the invention, the device includes water substantially filing the thermal energy accumulator.

In accordance with an additional feature of the invention the cooling air supply means is a three-chamber heat exchanger.

In accordance with a concomitant feature of the invention the thermal energy accumulator gives off thermal energy to the environment at low temperatures.

Such an apparatus is particularly effective if a storage medium with high specific heat such as water, is chosen. Such a choice of the storage medium can provide a larger heat accumulator capacity, without enlarging the mass and therefore the volume.

Other features which are considered as more specific characteristics of the invention are set forth in the appended claims.

Although the invention is illustrated and described herein as embodied in a cooling device, in which converters or rectifiers or other semiconductor components are immersed in boiling liquid, it is nevertheless not intended to be limited to the details shown, since various modifications and structural changes may be made therein without departing from the spriit of the invention and within the scope and range of equivalents of the claims.

Figure 2:
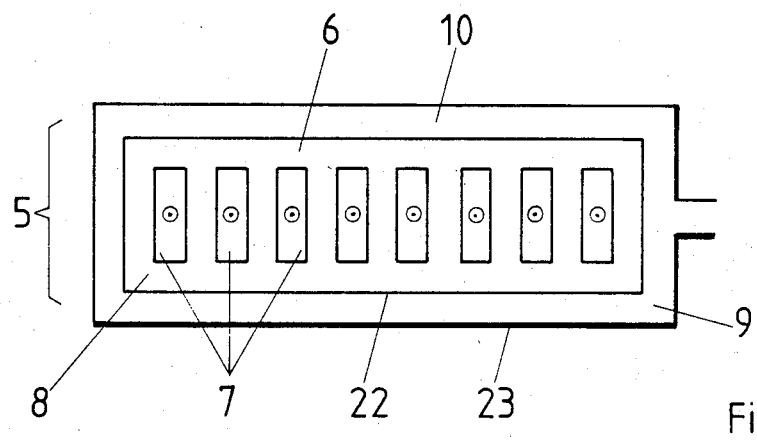

The construction and method of operation of the invention, however, together with additional objects and advantages thereof will be best understood from the following description of specific embodiments when read in connection with the accompanying drawings, in which:

FIG. 1 is a schematic and block circuit diagram of a converter with boiling liquid cooling and an additional thermal accumulator; and FIG. 2 is a diagrammatic, cross-sectional view of a heat exchanger taken along the line II—II in FIG. 1.

Referring now to the figures of the drawing in detail, and first particularly to FIG. 1 thereof, it is seen that a boiling liquid 2 is filled into a gas-tight tank 1 up to a given height H. The electrical components which are to be cooled are disposed in the boiling liquid 2. One component 3 which is shown in the boiling liquid 2, is connected by gas-tight electrical feedthroughs 4 in the wall of the tank 1 to non-illustrated components. Rising vapor 6 of the boiling liquid 2 is cooled and then condensed in a heat exchanger 5 which is located above the tank 1, and hydraulically connected to the tank 1.

As will be seen particularly from FIG. 2, the heat exchanger 5 is constructed as a 3-chamber cooler. An air duct 7, which is divided into many individual chambers, is surrounded by a chamber 8 in which the vapor 6 of the boiling liquid 2 rises. The chamber 8 is surrounded by a chamber 9 having walls 22, 23, in which water 10 for an additional thermal accumulator is conducted.

The air ducts 7 are ventilated by means of a blower 11 which is driven by a temperature-controlled motor 12. An accumulator 13, which is filled with the water 10 is connected to the chamber 9 of the heat exchanger 5. When a closed circulation of the storage liquid 10 is provided, this accumulator 13 is constructed in the form of a pressure accumulator 14. The accumulator 13 can be filled through a hand-operated valve 15. The accumulator is hydraulically connected to the heat exchanger 5 by pipes 16 and 17. The accumulator 13 is connected to or separated from the heat exchanger 5 by a temperature-controlled valve 18. It is ordinarily sufficient to provide such a temperature-controlled valve in only one pipeline. In order to obtain greater efficiency, it may be advantageous to surround the converter including the tank 1 with a boiling liquid and to surround the water accumulator with good thermal insulation 19. The air control is advantageously carried out in such a way, that when an over-temperature occurs outside the tank, heat removal by convection no longer occurs, not even due to thermal buoyancy.

The invention can be used in locomotives, for instance. It is particularly advantageous to use the invention for very long freight trains operated with multiple traction, as in North America. In this case the train is pulled by several locomotives which are distributed along the train assembly. These locomotives usually have diesel-electric propulsion. In such locomotives, a Diesel engine with a generator constitutes the energy source and electric motors are used as the propulsion engines which are controlled by converters that are cooled by boiling.

These freight trains also travel on tracks which lead through tunnels, and tunnel travel of half an hour in duration can occur. The power loss of the leading locomotives raises the tunnel temperature in such a manner that temperatures of up to 100° C. have been measured in the last locomotive.

Air cooling by means of forced convection is effective at temperatures of up to 40° C., while traveling in open terrain. If the train enters a tunnel and the drawn-in cooling air exceeds 40° C., the converter cooling is switched off at each locomotive. At the same time, the valve 18 is opened so that the water can flow through the water chamber 9 and absorb thermal energy. Circulation between the accumulator 13 and the water chamber 9 is produced due to thermo-syphon action. If the locomotive again enters open territory, the valve 18 is closed again only when the storage medium is cooled down again by the switched-on air cooling.

As is well known, the heat storage capacity of a body is proportional to its specific heat, its weight and the permissible temperature excursion. In the case of boiling cooling, the evaporation energy proportional to the temperature excursion must be added as another factor. In a converter constructed as a tank, a sum of the thermal capacities which must be taken into consideration for stroage operation therefore occurs. In converters with semiconductor elements, the limiting crystal temperature is about 120° C. It appears economically permissible to set a crystal temperature of 100° C. for a maximum air temperature of about 40° C. outside the tunnel. Thus a normal temperature excursion of $100-40=60$ K. and a storage temperature excursion of $120-100=20$ K. are available.

The storage medium used is of special importance. Generally, hydro-fluoro chloric acid with a specific heat of approximately 0.95 kJ per kg·K is used as the boiling liquid. Aluminum is approximately of the same order of magnitude given above, plastics are higher and steel and copper have about half this value. The average value of the specific heat can be set as about 1/5th of the value of water. Therefore, if water is used as the storage medium, only 20% of the weight and 30% of the volume of the boiling liquid is obtained, as compared to that which would be obtained if the operation were only carried out with boiling liquid. Due to the better heat transfer of water as compared to air and the already mentioned storage gain obtained by boiling over an excursion of 20 K., even further mass savings are obtained.

If the converter is constructed as an inverter, power capacitors are also required. These capacitors use oil as the insulating medium, which must also be present within the capacitor windings. If these capacitors are cooled down too much, the windings shrink and squeeze the oil out. The lower temperature limit for such capacitors is not as low as applications in countries such as those in North America dictate. At low temperatures, the capacitors must therefore be heated. The heating system can be switched off if the water accumulator is accommodated in the capacitor space and if it can also be added into the circuit at low temperatures. The air cooling can be switched off or provided in pulses.

The foregoing is a description corresponding, in substance, to German application P No. 32 36 612.4, dated Oct. 2, 1982, international priority of which is being claimed for the instant application, and which is hereby made part of this application. Any material discrepancies between the foregoing specification and the specification of the aforementioned corresponding German application are to be resolved in favor of the latter.

There is claimed:

1. Cooling device for semiconductor components, comprising a chamber for receiving semiconductor components, boiling liquid disposed in said chamber for immersing the semiconductor components, means connected to said chamber for supplying a cooling air to eliminate a temperature rise of said boiling liquid and to remove a maximum power loss at a normal maximum ambient temperature, a thermal energy accumulator connected to said chamber, and means for switching off said cooling air supply means and means for switching on said thermal energy accumulator if the ambient temperature of the cooling air rises.

2. Cooling device according to claim 1, wherein said accumulator switching means is a thermoelectric switching device.

3. Cooling device according to claim 2, including water substantially filling said thermal energy accumulator.

4. Cooling device according to claim 1, wherein said cooling air supply means is a three-chamber heat exchanger.

5. Cooling device according to claim 1, wherein said thermal energy accumulator gives off thermal energy to the environment at low temperatures.

* * * * *